US010648999B2

(12) United States Patent
Meinhold

(10) Patent No.: US 10,648,999 B2
(45) Date of Patent: May 12, 2020

(54) METHOD FOR MANUFACTURING AN ACCELERATION SENSOR

(71) Applicant: Infineon Technologies AG, Neubiberg (DE)

(72) Inventor: Dirk Meinhold, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 69 days.

(21) Appl. No.: 15/899,979

(22) Filed: Feb. 20, 2018

(65) Prior Publication Data

US 2018/0172724 A1 Jun. 21, 2018

Related U.S. Application Data

(63) Continuation of application No. 14/195,214, filed on Mar. 3, 2014, now abandoned.

(51) Int. Cl.
*H01R 31/00* (2006.01)
*G01P 15/12* (2006.01)
*H01L 41/25* (2013.01)
*G01P 15/08* (2006.01)

(52) U.S. Cl.
CPC .......... *G01P 15/12* (2013.01); *G01P 15/0802* (2013.01); *H01L 41/25* (2013.01)

(58) Field of Classification Search
CPC ....... G01P 15/12; G01P 15/0802; H01L 41/25
See application file for complete search history.

(56) References Cited

U.S. PATENT DOCUMENTS

| 4,788,867 A | 12/1988 | Kishel |
| 4,902,861 A | 2/1990 | Cook |
| 5,177,579 A | 1/1993 | Jerman |
| 5,310,104 A | 5/1994 | Zaidel |
| 5,413,659 A | 5/1995 | Koskenmaki |
| 5,529,829 A | 6/1996 | Koskenmaki |
| 5,591,910 A | 1/1997 | Lin |
| 5,656,778 A | 8/1997 | Roszhart |
| 6,464,444 B1 | 10/2002 | Tsuji |
| 6,845,670 B1 | 1/2005 | McNeil |
| 7,019,231 B2 | 3/2006 | Ishikawa et al. |
| 7,084,759 B2 | 8/2006 | Cox |
| 7,194,905 B2 | 3/2007 | Yamamoto |
| 7,243,551 B2 | 7/2007 | Fischer |
| 7,305,890 B2 | 12/2007 | Zias |
| 7,322,236 B2 | 1/2008 | Combi |
| 7,490,522 B2 | 2/2009 | Ruehrig |
| 7,600,428 B2 | 10/2009 | Robert |
| 7,757,555 B2 | 7/2010 | Pan |
| 7,950,281 B2 | 5/2011 | Hammerschmidt |
| 8,049,287 B2 | 11/2011 | Combi |
| 8,207,004 B2 | 6/2012 | Chen |
| 8,266,962 B2 | 9/2012 | Kautzsch |
| 8,408,075 B2 | 4/2013 | Okada |

(Continued)

FOREIGN PATENT DOCUMENTS

CN 103163326 6/2013

*Primary Examiner* — Paul D Kim
(74) *Attorney, Agent, or Firm* — Harrity & Harrity, LLP

(57) ABSTRACT

Various acceleration sensors are disclosed. In some cases, an inertial mass may be formed during back-end-of-line (BEOL). In other cases, a membrane may have a bent, undulated or winded shape. In yet other embodiments, an inertial mass may span two or more pressure sensing structures.

13 Claims, 3 Drawing Sheets

(56) References Cited

U.S. PATENT DOCUMENTS

| | | |
|---|---|---|
| 8,418,559 B2 | 4/2013 | Pan |
| 8,429,971 B2 | 4/2013 | Classen et al. |
| 8,530,259 B2 | 9/2013 | Chen |
| 8,584,522 B2 | 11/2013 | Acar |
| 8,835,319 B2 | 9/2014 | Meinhold |
| 8,939,029 B2 | 1/2015 | Zhang |
| 8,991,253 B2 | 3/2015 | Theuss |
| 9,075,078 B2 | 7/2015 | Theuss |
| 9,550,669 B2 * | 1/2017 | Kautzsch ............ B81C 1/00158 |
| 9,581,512 B2 | 2/2017 | Lin |
| 2008/0216573 A1 | 9/2008 | Katou |
| 2012/0073371 A1 | 3/2012 | Theuss |
| 2013/0125652 A1 | 5/2013 | Kim |
| 2013/0139594 A1 | 6/2013 | Mao |
| 2015/0247879 A1 | 9/2015 | Meinhold |

\* cited by examiner

METHOD FOR MANUFACTURING AN ACCELERATION SENSOR

RELATED APPLICATION

This application is a continuation of U.S. patent application Ser. No. 14/195,214, filed Mar. 3, 2014, the disclosure of which is incorporated herein by reference.

TECHNICAL FIELD

The present application relates to acceleration sensors and to corresponding methods.

BACKGROUND

Acceleration sensors are used for many applications, for example in the automotive field. In some embodiment, acceleration sensors may simply be used as "wake up sensors" to detect when a vehicle like an automobile starts moving or reaches a certain speed and to activate other sensors or components in response to the detection of the movement via an acceleration.

In some cases, acceleration sensors may be needed together with pressure sensors, for example for tire pressure monitoring system (TPMS) applications. In some conventional realizations of such a sensor combination, the pressure sensor and the acceleration sensor are manufactured separately, or are integrated using separate structures, for example differently structured micro-electro-mechanical systems (MEMS) parts formed within a wafer.

DETAILED DESCRIPTION

Figure 1:
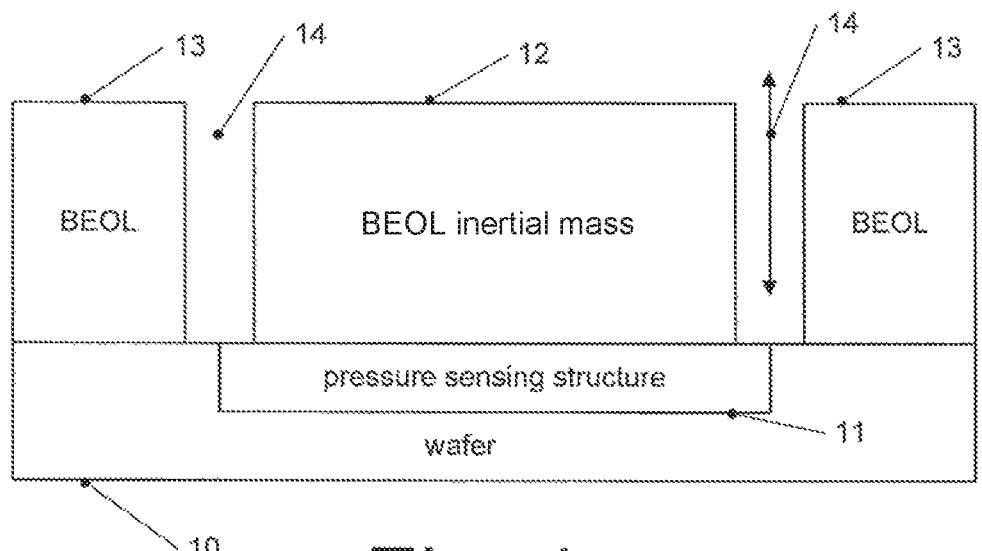
FIG. 1 is a block diagram of an acceleration sensor according to an embodiment.

In the following, various illustrative embodiments will be described in detail with reference to the attached drawings. It should be noted that these embodiments serve only as examples and are not to be construed as limiting.

For instance, while embodiments may be described comprising a plurality of features or elements, in other embodiments some of these features or elements may be omitted and/or replaced by alternative elements. Also, in some embodiments, additional features or elements apart from the ones shown and described may be implemented. Features or elements from different embodiments may be combined with each other unless specifically noted otherwise.

Any directional terminology is merely used to easily indicate parts or directions in the figures and does not imply a specific orientation of implementations of embodiments.

Fabrication of integrated circuits or other semiconductor devices is often categorized into at least two phases, comprising front-end-of-line (FEOL) and back-end-of-line (BEOL). After BEOL there additionally may be a backend process, also referred to as post fab. FEOL as used in this application may designate a first phase of fabrication where individual devices, for example transistors (including e.g. gate formation), capacitors, resistors and/or mechanical structures for micro-electro-mechanical systems (MEMS) are patterned in a semiconductor wafer. FEOL therefore may cover everything up to but not including the deposition of metal interconnect layers. For example, for manufacturing CMOS elements, FEOL may comprise selecting a type of wafer to be used, chemical-mechanical planarization and cleaning of the wafer, shallow trench isolation, well formation, gate module formation and source and drain module formation.

BEOL as used herein is a second phase of fabrication which generally begins for example when the first layer of metal is deposited on the semiconductor wafer. BEOL includes formation of contacts, isolating layers (e.g. oxides or nitrides), metal layers and bonding sides for chip to package connection. For example, in some processes up to ten metal layers may be added in the BEOL, although depending on the process also less metal layers may be used.

Therefore, FEOL and BEOL are well-defined technical terms, and for a person skilled in the art it is clear which parts of a given device are manufactured in FEOL and which parts are manufactured in BEOL.

In some embodiments, an acceleration sensor comprises a wafer, the wafer comprising a pressure sensing structure formed therein, and an inertial mass formed in BEOL, i.e. a BEOL structure, disposed over the sensing structure. The sensing structure in embodiments may comprise a membrane.

In some embodiments, the wafer comprising the sensing structure, without the inertial mass, would be operable as a pressure sensor.

In some embodiments, an inertial mass may be disposed spanning at least two pressure sensing structures, e.g. membranes, formed on or in a wafer. The inertial mass may be an inertial mass formed in BEOL. With such an embodiment, acceleration parallel to a plane (e.g. surface) of the wafer may be sensed.

In still other embodiments, an inertial mass is provided above a membrane. At least one portion of the membrane outside the inertial mass may have a winded, bent or undulated shape. In some embodiments, through the winding, bending or undulating a sensitivity may be increased.

In some embodiments, together with forming the acceleration sensor e.g. during FEOL and BEOL, other devices, for example circuits, may be formed in and/or on a same wafer and integrated with the acceleration sensor. For example, one or more further sensors, e.g. a pressure sensor, and/or circuitry, e.g. circuitry to control and/or read the acceleration sensor, may be integrated with the acceleration sensor in this way in some embodiments.

The above-described embodiments may be combined with each other, but may also be used separately from each other.

Further embodiments will now be discussed referring to the figures.

In FIG. 1, a cross-sectional view of an acceleration sensor (e.g. an accelerometer) according to an embodiment is shown. The acceleration sensor of FIG. 1 comprises a wafer 10, for example a semiconductor wafer like a silicon wafer. A wafer as used herein may be used interchangeably with the term "substrate" and generally refers to an essentially planar or plate-like material in or upon which structures, e.g. semiconductor device structures, may be formed. Wafer 10 in the embodiment of FIG. 1 has a pressure sensing structure 11 formed therein. In some embodiments, pressure sensing structure 11 may comprise a membrane or any other pressure-sensitive structure. In one embodiment pressure sensing structure 11 may be at least partly manufactured in FEOL.

On top of wafer 10 of FIG. 1, BEOL layers, i.e. layers manufactured during BEOL, are provided. These layers may, for example, comprise one or more metal layers like a copper layer, for example dual damascene copper layers, or aluminum layers, and/or may comprise one or more dielectric layers like oxide layers or nitride layers. An overall thickness of the BEOL layers may be in the order of some micrometers, for example, between 1 μm and 15 μm. In the embodiment of FIG. 1, the BEOL layer has been structured to separate a part serving as an inertial mass 12 from a remaining BEOL layer 13 by gaps 14. Any conventional structuring techniques may be used. For example, a mask may be provided prior to depositing the BEOL layer.

When the acceleration sensor of FIG. 1 is accelerated in a direction perpendicular to a surface of wafer 10 (direction as indicated by an arrow 14), inertial mass 12 exerts pressure on pressure sensing structure 11 or removes pressure from pressure sensing structure 11 depending on the direction of acceleration. For example, when the accelerometer is accelerated in an upward direction in FIG. 1, a pressure on sensing structure 11 increases, while with an acceleration in the opposite direction pressure decreases due to the inertia of inertial mass 12. This change in pressure may be detected by pressure sensing structure 11, thus detecting an acceleration.

It should be noted that the term "acceleration perpendicular to the wafer surface" also comprises acceleration where only a component is perpendicular to the wafer surface.

In some embodiments, a pressure sensor using pressure sensing structure 11 may be modified to become an acceleration sensor by providing inertial mass 12. In some embodiments, therefore essentially the same process may be used for forming a pressure sensor and for forming the acceleration sensor of the embodiment of FIG. 1. An embodiment illustrating this concept further will be discussed later with reference to FIGS. 3 and 4.

Figure 2:
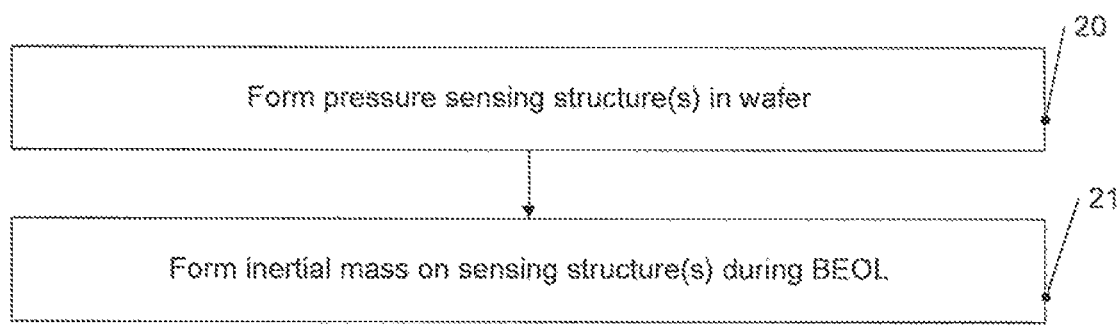
FIG. 2 is a method for manufacturing an acceleration sensor according to an embodiment.

In FIG. 2, a method according to an embodiment is shown. The method of FIG. 2 may, for example, be used to manufacture the acceleration sensor of FIG. 1, but may also be used to form other kinds of acceleration sensors, for example, acceleration sensors as will be explained later with reference to FIGS. 3-6, but not limited thereto.

At 20, one or more pressure sensing structures are formed in a wafer. For example, a pressure sensing structure using a membrane may be formed.

At 21, during BEOL an inertial mass is formed on the pressure sensing structure. In some embodiments, the inertial mass may be formed on a single pressure sensing structure. As will be explained later, in some embodiments the inertial mass may also span two or more sensing structures in order to provide the possibility to sense acceleration in a direction parallel to a surface of the water (e.g. acceleration or acceleration components perpendicular to arrow 14 of FIG. 1). In some embodiments, the inertial mass may also be formed in a different manufacturing phase than BEOL.

Next, with reference to FIGS. 3 and 4 an embodiment will be explained where a pressure sensor is modified to become an acceleration sensor. First, with reference to FIGS. 3A and 3B, the structure of the pressure sensor will be explained, and then with reference to FIG. 4 an acceleration sensor according to an embodiment will be discussed in detail.

Figure 3A:
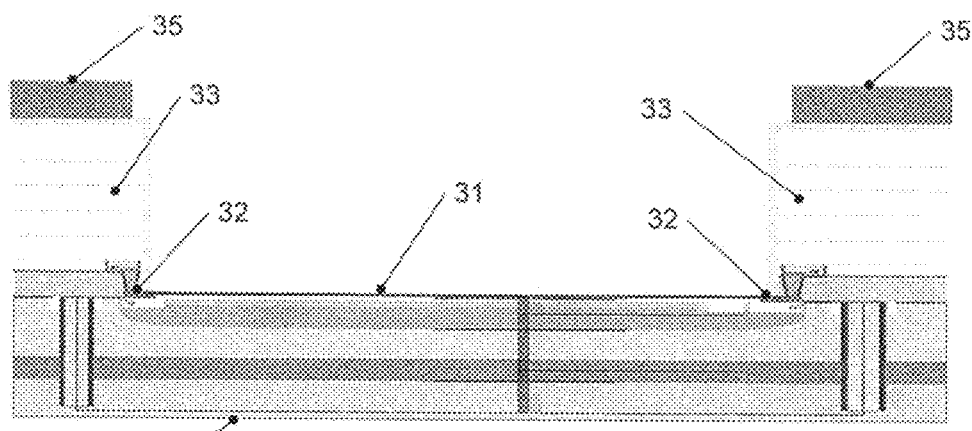
FIGS. 3A and 3B show schematic cross-sectional views of a pressure sensor which may form the basis of an acceleration sensor according to an embodiment.

In FIG. 3A, a schematic cross-sectional view of a pressure sensor is shown. FIG. 3B shows an enlarged view of some parts of the pressure sensor.

Figure 3B:
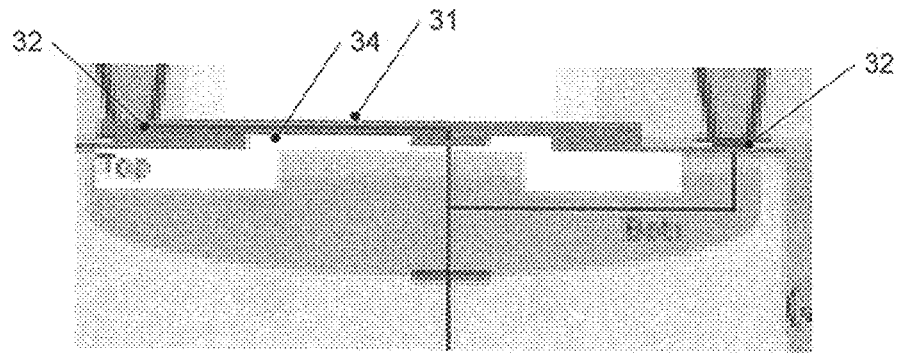

The pressure sensor of FIGS. 3A and 3B comprises a wafer 30 in which structures for sensing pressure have been formed. The structures comprise a membrane 31 which is separated from further portions and structures formed in wafer 30 by a gap 34, which may have a width of the order of 50 nm to 100 nm, but is not limited to these values. Membrane 31 may also be referred to as a lamella.

At edges of membrane 31, structures generally labeled 32 are formed to sense a pressure exerted on membrane 31, which pressure results in a displacement and/or change of tension of membrane 31. For example, within wafer 30 resistive structures may be formed which change their resistance depending on displacements of membrane 31. For formation of the above-mentioned structures, any techniques conventionally employed for manufacturing micro-electromechanical systems (MEMS) or semiconductor devices may be used.

On top of wafer 30, BEOL layers 33 are formed. The BEOL layers may for example comprise alternating metal layers and dielectric layers and may be capped with a thicker metal layer 35 which may be manufactured by electroless plating, for example, on top. The depicted layers serve only as examples, and other structures may be used as well. Above membrane 31, as can be seen best in FIG. 3A, the BEOL layers are removed such that membrane 31 is subject to ambient pressure, thus enabling the structure of FIG. 3 to act as a pressure sensor.

It should be noted that during FEOL and BEOL as mentioned above, in addition to the pressure sensor shown additional structures and devices, for example additional sensors and/or electronic circuits, may be formed in wafer 30 using conventional fabrication techniques.

Figure 4:
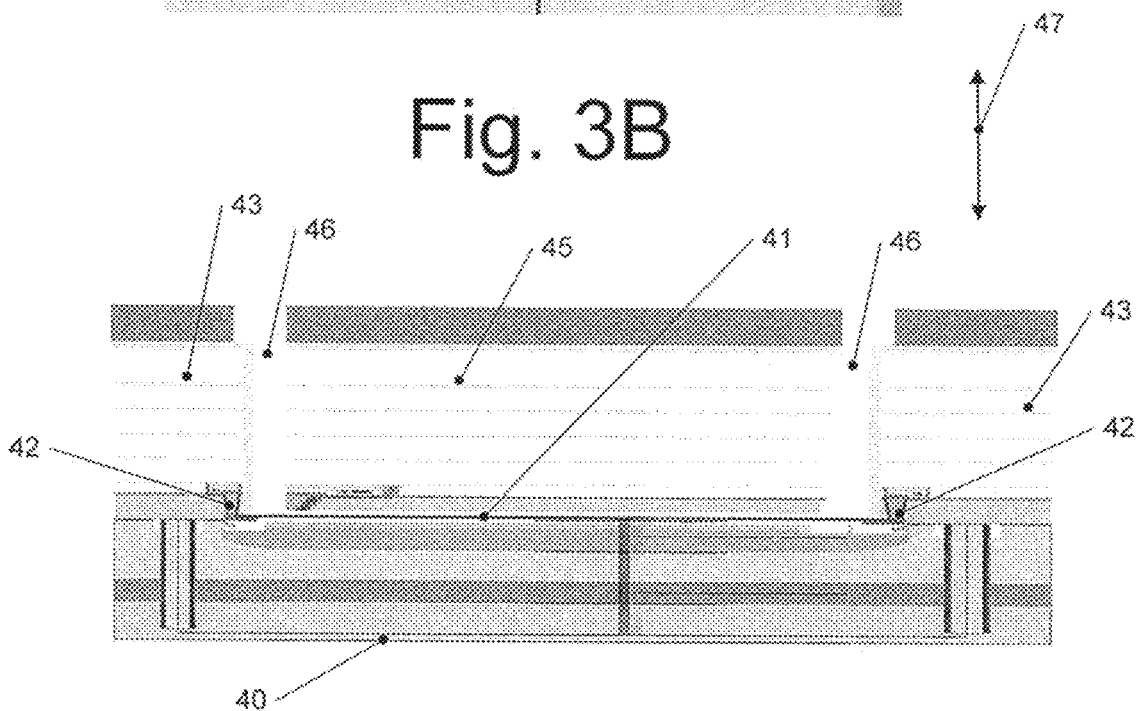
FIG. 4 shows a schematic cross-sectional view of an acceleration sensor according to an embodiment manufactured on the basis of the pressure sensor of FIGS. 3A and 3B.

In FIG. 4, an acceleration sensor according to an embodiment which is implemented on the basis of the pressure sensor of FIG. 3 is shown. Elements 40-43 correspond to elements 30-33 of the pressure sensor of FIG. 3 and will not be discussed above in detail. Also, any additions or variations discussed, with reference to FIG. 3, e.g. the formation of additional structures and devices, may also apply to the embodiment of FIG. 4 in some cases.

In contrast to the pressure sensor of FIG. 3, a BEOL layer stack serving as an inertial mass 45 remains on top of membrane 41. Inertial mass 45 is separated from remaining BEOL layers 43 by gaps 48. When the acceleration sensor of FIG. 4 is accelerated in a direction perpendicular to a surface of wafer 40 as indicated by an arrow 47, through the inertia of inertial mass 45 membrane 41 is displaced, which may be measured via structures 42. In this way, the acceleration may be measured. In the embodiment of FIG. 4, in gaps 46 portions of membrane 41 remain free from inertial mass 45.

Therefore, by providing inertial mass 45 on top of a membrane of a pressure sensor, the pressure sensor may be converted to an acceleration sensor.

A membrane like membrane 41 may, for example, have an area in the range of 5 μm·5 μm to 30 μm·30 μm, for example, 10 μm·10 μm or 15 μm·15 μm, but is not limited to these values, which are given merely as examples. The BEOL layers may, for example, comprise silicon oxide layers, copper layers, tantalum layers, tungsten layers, nickel phosphide (NiP) layers, platinum layers and/or aluminum layers.

A weight of the inertial mass may, for example, be of the order of $5\text{-}6 \cdot 10^{-11}$ g/$\mu$m$^2$. A diameter of mass 45 may, for example, be of the order of 9 $\mu$m, and as mentioned an area covered by inertial mass 45 may, for example, be slightly smaller than the area of membrane 41.

In some embodiments, for example, a sensitivity sufficient to detect accelerations of the order of $2,3 \cdot 10^{-4}$ kg·m/s$^2$ may be obtained. This may be sufficient for some applications, for example, for a wake up application in tire pressure monitoring systems (TPMS). For example, in an embodiment where the pressure sensor of FIG. 4 is mounted to a tire with inertial mass 45 facing inwards (i.e. towards an axle), if may be sensed when a speed exceeds a velocity of the order of 25 km/h in some embodiments, The numerical values above are merely given to illustrate the capabilities of some embodiments and are not to be construed as limiting. For example, in other embodiments to increase a sensitivity the mass of inertial mass 45 may be increased, for example, by increasing a thickness of a metal layer provided on top of inertial mass 45 (similar to metal layer 35 of FIG. 3A), or by increasing the area of the membrane.

A further possibility to increase sensitivity in sense embodiments will now be discussed with reference to FIG. 5.

Figure 5:
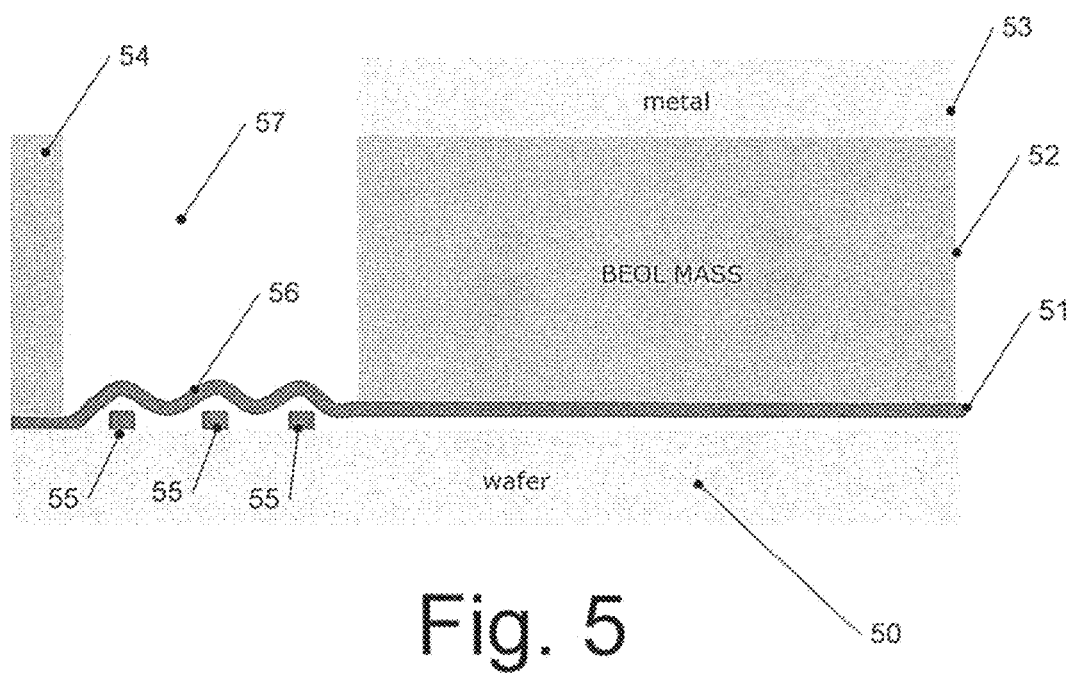
FIG. 5 shows a schematic cross-sectional view of an acceleration sensor according to an embodiment.

FIG. 5 shows a simplified partial cross-sectional view of an acceleration sensor according to a further embodiment. In the embodiment of FIG. 5, as a pressure-sensitive element a membrane 51 is formed in a wafer 50 and is separated from wafer 50 in a certain area by a gap, as already explained for membranes 31 and 41 with reference to FIGS. 3 and 4. On top of membrane 51, an inertial mass 52 is formed. In some embodiments, inertial mass 52 may be a BEOL inertial mass, i.e., formed during BEOL of a manufacturing process, and may comprise a metal layer 53 on top which may be formed via electroless plating, for example. In other embodiments, other kinds of inertial masses may be provided, inertial mass 52 in the embodiment of FIG. 5 is separated from a remaining BEOL layer 54 by a gap 57. So far, the embodiment of FIG. 5 may correspond to the embodiment of FIG. 4, and variations and modifications and implementation specifics discussed with reference to FIG. 4 in some embodiments may also apply to the embodiment of FIG. 5.

Within gap 57, where membrane 51 is free of inertial mass 52, in the embodiment of FIG. 5 as indicated by 58 membrane 51 has an undulating, winded and/or bent shape. In the embodiment of FIG. 5, this shape is caused by providing elements 55 on water 50 adjacent to gap 57. These elements 55 may be manufactured during FEOL and may, for example, be made of polycrystalline silicon deposited during a gate formation process or other polycrystalline silicon deposition processes used during FEOL. In other embodiments, elements 55 may be deposited using other processes. Through the provision of elements 55, during manufacturing also the gap between water 50 and membrane 51 follows the shape of elements 55 to provide the shown undulating, bent and/or winded shape. A thickness of elements 55 may, for example, be of the order of 50 $\mu$m to 300 $\mu$m, for example, about 240 $\mu$m, and may in embodiments be in the order of a thickness of the gap between membrane 51 and wafer 50. The number of elements shown in FIG. 5 is not to be construed as limiting, and other numbers may also be used.

With the embodiments of acceleration sensors discussed so far, acceleration or acceleration components perpendicular to a wafer surface may be detected. In some applications, it may additionally be desirable to detect acceleration or acceleration components parallel to a wafer surface. A schematic cross-sectional view of a corresponding embodiment is shown in FIG. 6.

Figure 6:
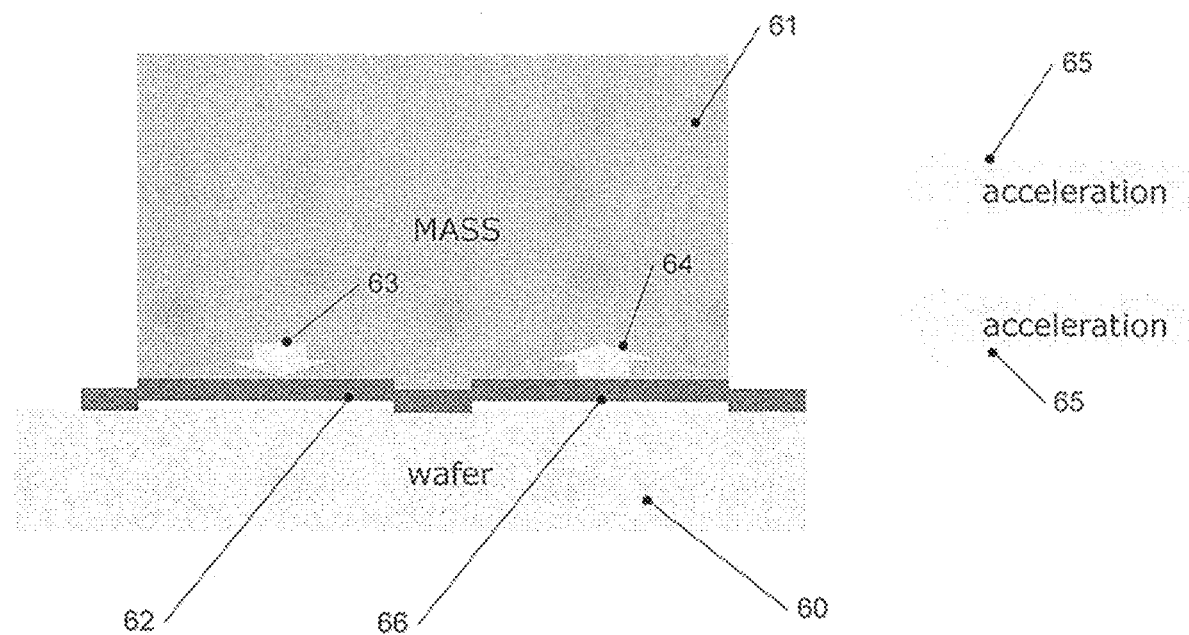
FIG. 6 shows a schematic cross-sectional view of an acceleration sensor according to a further embodiment.

In the embodiment of FIG. 6, two membranes 62, 66 are provided beside each other on a wafer 60. Each of membrane 62, 66 may be configured and formed as discussed with reference to FIGS. 3 to 5. In other words, each membrane 62, 66 in some embodiments may be an independently operable sensing element of an independent pressure sensor. Spanning membranes 62, 66, a mass 61 is formed on wafer 60. In some embodiments, mass 61 may be formed during BEOL and/or may comprise oxide layers, metal layers, nitride layers and the like.

Similar to the embodiments discussed so far, with the acceleration sensor of FIG. 6 an acceleration in a direction perpendicular to a plane of wafer 60 may be detected. Additionally, in the embodiment of FIG. 6, an acceleration in a direction parallel to the surface of wafer 60, for example, an acceleration as indicated by arrows 65, may be detected. With such an acceleration, as indicated by arrows 63, 64, for example, depending on the distribution of inertial mass 61 on membranes 62, 66, inertial mass 61 may press on membrane 62 and remove pressure from membrane 66. This enables a detection of the acceleration. In contrast, with an acceleration perpendicular to the surface of wafer 60, the effects on both membranes 62, 66 would be essentially the same or at least in the same direction.

It should be noted that while in the cross-sectional view of FIG. 6 inertial mass 61 is shown as spanning two membrane 62, 66, in other embodiments for example four membranes may be arranged in a square configuration, and the inertial mass may span such four membranes, to enable a defection of acceleration in different directions parallel to the surface of a wafer. Moreover, while membranes are shown as pressure-sensitive elements in FIG. 6, in other embodiments other pressure sensing structures may be used.

The above-described embodiments serve only as illustrative examples and are not to be construed as limiting the scope of the present application.

What is claimed is:

1. A method for manufacturing an acceleration sensor, the method comprising:
   forming a pressure sensing structure in a wafer;
   providing, during a front end of line (FEOL), elements on a surface of the wafer;
   forming, during a back end of line (BEOL), a BEOL inertial mass of metal layers and dielectric layers disposed over the surface of the wafer,
   where the BEOL inertial mass is formed during the BEOL on the pressure sensing structure; and
   forming, during the BEOL, a BEOL layer over the surface of the wafer such that the BEOL inertial mass and the BEOL layer are separated by the elements.

2. The method of claim 1, where the pressure sensing structure comprises a membrane.

3. The method of claim 2, where the membrane has an area in a range of 5 $\mu$m·5 $\mu$m to 30 $\mu$m·30 $\mu$m.

4. The method of claim 1, where the pressure sensing structure is a single pressure sensing structure, and
   where the BEOL inertial mass is formed on the single pressure sensing structure.

5. The method of claim 1, where the BEOL inertial mass is a discrete inertial mass that spans a plurality of sensing structures,
   the plurality of sensing structures including the pressure sensing structure.

6. The method of claim 1, where the BEOL inertial mass is capped with a metal layer.

7. The method of claim 1, where the BEOL inertial mass comprises a plurality of alternating metal layers and dielectric layers.

8. The method of claim 1, further comprising:
forming another pressure sensing structure in the wafer.

9. The method of claim 8, where the pressure sensing structure comprises a first membrane and the other pressure sensing structure comprises a second membrane.

10. The method of claim 1, wherein the elements are made of polycrystalline silicon.

11. The method of claim 1, wherein the elements are manufactured during a gate formation process.

12. The method of claim 1, further comprising:
forming a membrane over the wafer and the elements, wherein the BEOL layer and the BEOL inertial mass are formed over the membrane.

13. The method of claim 12, wherein a gap is formed between the wafer and the membrane and between the elements.

\* \* \* \* \*